(12) United States Patent
Kim et al.

(10) Patent No.: US 11,056,665 B2
(45) Date of Patent: Jul. 6, 2021

(54) ELECTROLUMINESCENT DISPLAY DEVICE

(71) Applicant: LG Display Co., Ltd., Seoul (KR)

(72) Inventors: Jin-Tae Kim, Gumi-si (KR); Woo-Ram Youn, Chilgok-gun (KR)

(73) Assignee: LG DISPLAY CO., LTD., Seoul (KR)

( * ) Notice: Subject to any disclaimer, the term of this patent is extended or adjusted under 35 U.S.C. 154(b) by 31 days.

(21) Appl. No.: 16/197,022

(22) Filed: Nov. 20, 2018

(65) Prior Publication Data

US 2019/0165301 A1  May 30, 2019

(30) Foreign Application Priority Data

Nov. 30, 2017 (KR) .................... 10-2017-0163170

(51) Int. Cl.
*H01L 51/52* (2006.01)
*H01L 27/32* (2006.01)
*H01L 51/50* (2006.01)

(52) U.S. Cl.
CPC ........ *H01L 51/5209* (2013.01); *H01L 27/322* (2013.01); *H01L 27/326* (2013.01); *H01L 51/5225* (2013.01); *H01L 51/5271* (2013.01); *H01L 51/5275* (2013.01); *H01L 51/504* (2013.01); *H01L 51/5253* (2013.01)

(58) Field of Classification Search
CPC ............... H01L 51/5209; H01L 27/322; H01L 51/5225; H01L 51/5271; H01L 51/5275; H01L 51/504
See application file for complete search history.

(56) References Cited

U.S. PATENT DOCUMENTS

| | | | |
|---|---|---|---|
| 2004/0113550 A1* | 6/2004 | Adachi | H01L 51/525 313/512 |
| 2005/0116620 A1* | 6/2005 | Kobayashi | H01L 51/5271 313/503 |
| 2013/0069046 A1* | 3/2013 | Ishizuya | H01L 51/5271 257/40 |
| 2017/0062770 A1* | 3/2017 | Jang | H01L 51/5271 |
| 2018/0012945 A1* | 1/2018 | Sakamoto | H01L 27/3246 |

* cited by examiner

*Primary Examiner* — Fernando L Toledo
*Assistant Examiner* — Neil R Prasad
(74) *Attorney, Agent, or Firm* — Seed IP Law Group LLP

(57) ABSTRACT

An electroluminescent display device includes a substrate; an overcoat layer disposed over the substrate; and a light-emitting diode disposed on the overcoat layer, comprising: a first electrode having a plurality of holes exposing a top surface of the overcoat layer, the holes having an inclined wall surface; a light-emitting layer disposed on the first electrode; and a second electrode disposed on the light-emitting layer.

26 Claims, 12 Drawing Sheets

ELECTROLUMINESCENT DISPLAY DEVICE

CROSS-REFERENCE TO RELATED APPLICATIONS

This application claims the benefit under 35 U.S.C. § 119(a) of Korean Patent Application No. 2017-0163170, filed Nov. 30, 2017, in the Korean Intellectual Property Office, which is incorporated herein by reference in its entirety.

BACKGROUND

Technical Field

The present disclosure relates to an electroluminescent display device, and more particularly, to an electroluminescent display device capable of improving light extraction efficiency.

Description of the Related Art

In recent years, flat panel displays having excellent characteristics such as being thin, lightweight, and having low power consumption have been widely developed and applied to various fields.

Among the flat panel displays, an electroluminescent display device is a device in which electrical charge carriers are injected into a light-emitting layer formed between a cathode, which is an electron-injecting electrode, and an anode, which is a hole-injecting electrode, such that excitons are formed, and then radiative recombination of the excitons occurs, thereby emitting light.

The electroluminescent display device can be formed using a flexible substrate such as plastic because it is self-luminous, and has excellent contrast ratios. Further the electroluminescent display device has a response time of several micro seconds, and there are advantages in displaying moving images. The electroluminescent display device also has wide viewing angles and is stable under low temperatures. Since the electroluminescent display device is driven by a low voltage of direct current DC 5V to 15V, it is easy to design and manufacture driving circuits.

FIG. 1 is a schematic cross-sectional view of a related art electroluminescent display device.

As illustrated in FIG. 1, an electroluminescent display device 1 includes a substrate 10, a thin film transistor Tr disposed on the substrate 10, and a light-emitting diode D disposed on the substrate 10 and connected to the thin film transistor Tr. An encapsulation layer (not shown) may be disposed on the light-emitting diode D.

The light-emitting diode D includes a first electrode 41, a light-emitting layer 42, and a second electrode 43, wherein light from the light-emitting layer 42 is output to the outside through the first electrode 41.

The light emitted from the light-emitting layer 42 passes through various configurations of the electroluminescent display device 1 and exits the electroluminescent display device 1.

However, an optical waveguide mode which is configured by a surface plasmon component generated at a boundary between a metal and the light-emitting layer 42 and the light-emitting layer 42 inserted between reflective layers at both sides accounts for about 60 to 70% of emitted light.

Accordingly, among light emitted from the light-emitting layer 42, rays of light that are trapped in the electroluminescent display device 1 instead of exiting the electroluminescent display device 1 are present. Thus, there is a problem in that light extraction efficiency of the electroluminescent display device 1 is degraded.

BRIEF SUMMARY

Accordingly, embodiments of the present disclosure are directed to an electroluminescent display device that substantially obviates one or more of the problems due to limitations and disadvantages of the related art.

It is an object of the present disclosure to provide an electroluminescent display device in which a plurality of holes are formed in a first electrode and an insulating pattern is disposed on a bottom surface and an inclined surface of the plurality of holes so that light extraction efficiency is improved.

To achieve these and other advantages and in accordance with the purpose of the present disclosure, as embodied and broadly described herein, the present disclosure provides an electroluminescent display device which includes a substrate; an overcoat layer disposed over the substrate; and a light-emitting diode disposed on the overcoat layer, comprising: a first electrode having a plurality of holes exposing a top surface of the overcoat layer, the holes having an inclined wall surface; a light-emitting layer disposed on the first electrode; and a second electrode disposed on the light-emitting layer.

It is to be understood that both the foregoing general description and the following detailed description are by example and explanatory, and are intended to provide further explanation of the present disclosure as claimed.

BRIEF DESCRIPTION OF THE SEVERAL VIEWS OF THE DRAWINGS

The accompanying drawings, which are included to provide a further understanding of the present disclosure and which are incorporated in and constitute a part of this specification, illustrate embodiments of the present disclosure and together with the description serve to explain various principles of the present disclosure. In the drawings.

DETAILED DESCRIPTION

Hereinafter, exemplary embodiments of the present disclosure will be described with reference to the accompanying drawings.

First Embodiment

Figure 1:
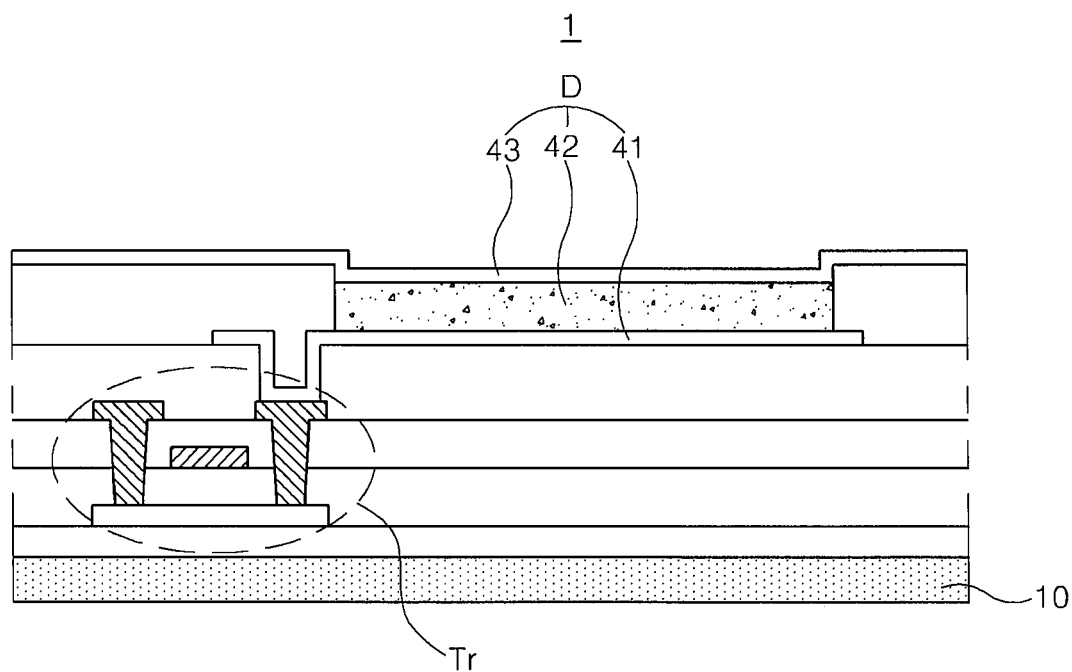
FIG. 1 is a cross-sectional view schematically illustrating a conventional electroluminescent display device.
Figure 2:
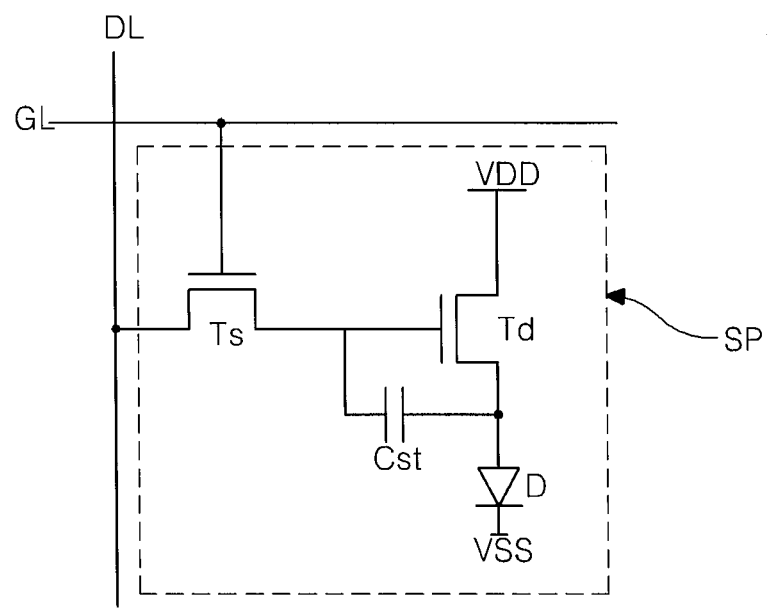
FIG. 2 is a circuit diagram illustrating a single subpixel area of an electroluminescent display device according to an embodiment of the present disclosure.

FIG. 2 is a circuit diagram illustrating a subpixel area of an electroluminescent display device according to an embodiment of the present disclosure.

As illustrated in FIG. 2, the electroluminescent display device according to the embodiment of the present disclosure includes a gate line GL, a data line DL, a switching thin film transistor Ts, a driving thin film transistor Td, a storage capacitor Cst and a light-emitting diode D. The gate line GL and the data line DL cross each other to define a subpixel area SP. The switching thin film transistor Ts, the driving thin film transistor Td, the storage capacitor Cst and the light-emitting diode D are formed in the subpixel area SP.

More specifically, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts, and a source electrode of the driving thin film transistor Td is connected to a high voltage supply VDD. An anode of the light-emitting diode D is connected to a drain electrode of the driving thin film transistor Td, and a cathode of the light-emitting diode D is connected to a low voltage supply VSS. The storage capacitor Cst is connected to the gate electrode and the drain electrode of the driving thin film transistor Td.

The electroluminescent display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts.

When the driving thin film transistor Td is turned on by the data signal, an electric current flowing through the light-emitting diode D is controlled, thereby displaying an image. The light-emitting diode D emits light due to the current supplied through the driving thin film transistor Td from the high voltage supply VDD.

That is, the amount of the current flowing through the light-emitting diode D is proportional to the magnitude of the data signal, and the intensity of light emitted by the light-emitting diode D is proportional to the amount of the current flowing through the light-emitting diode D. Thus, subpixel areas SP show different gray levels depending on the magnitude of the data signal, and as a result, the electroluminescent display device displays an image.

The storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light-emitting diode D to be constant and the gray level shown by the light-emitting diode D to be maintained until a next frame.

A transistor and/or a capacitor other than the switching and driving thin film transistors Ts and Td and the storage capacitor Cst may be further added in the subpixel area SP.

Figure 3:
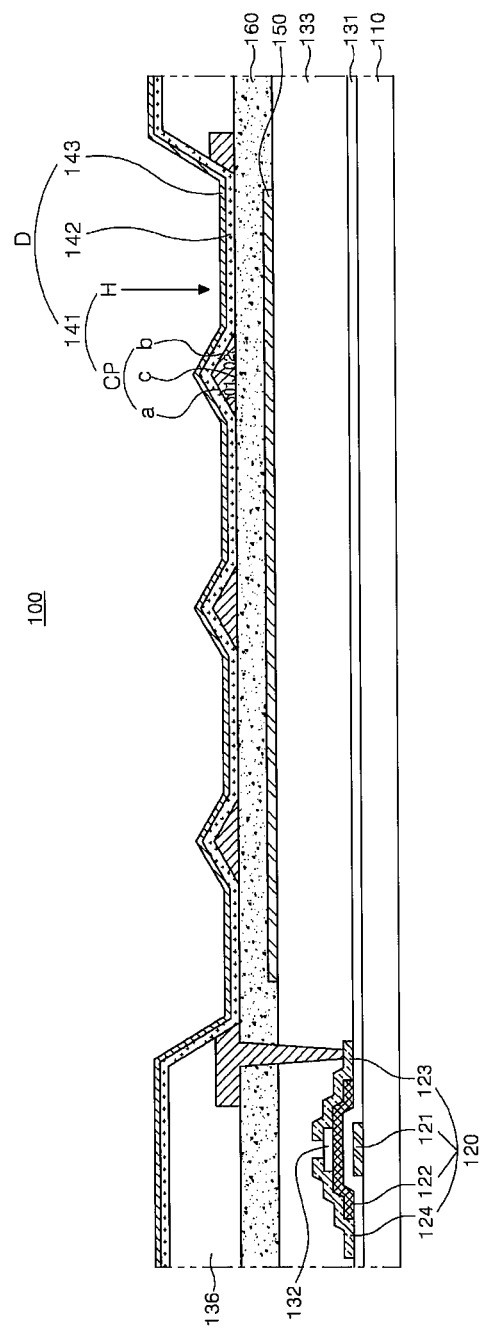
FIG. 3 is a cross-sectional view schematically illustrating an electroluminescent display device according to a first embodiment of the present disclosure.

FIG. 3 is a cross-sectional view schematically illustrating an electroluminescent display device according to a first embodiment of the present disclosure.

As illustrated in FIG. 3, an electroluminescent display device 100 according to the first embodiment of the present disclosure may include a substrate 110, a thin film transistor 120, a color filter pattern 150, an overcoat layer 160, and a light-emitting diode D electrically connected to the thin film transistor 120.

The electroluminescent display device 100 according to the first embodiment of the present disclosure is illustrated as being a bottom emission type in which light from a light-emitting layer 142 is output to the outside through a first electrode 141, but embodiments are not limited thereto.

That is, the electroluminescent display device 100 according to the first embodiment of the present disclosure may also be a top emission type in which the color filter pattern 150 is located opposite the substrate 110 and light from the light-emitting layer 142 is output to the outside through a second electrode 143.

When the electroluminescent display device 100 is the top emission type, a reflective electrode or a reflective layer may be further formed below the first electrode 141. For example, the reflective electrode or the reflective layer may be formed of an aluminum-palladium-copper (APC) alloy. In this case, the second electrode 143 may have a relatively thin thickness so as to transmit light therethrough.

The electroluminescent display device 100 according to the first embodiment of the present disclosure may include, on the substrate 110, a thin film transistor 120 which includes a gate electrode 121, an active layer 122, a source electrode 123, and a drain electrode 124.

Specifically, the gate electrode 121 of the thin film transistor 120 and a gate insulation layer 131 may be disposed on the substrate 110.

The active layer 122, which overlaps the gate electrode 121, may be disposed on the gate insulation layer 131.

An etch stopper 132 for protecting a channel region of the active layer 122 may be disposed on the active layer 122.

The source electrode 123 and the drain electrode 124 may be disposed on the active layer 122 and contact the active layer 122.

The electroluminescent display device 100 to which the first embodiment of the present disclosure is applicable is not limited to that illustrated in FIG. 3. The electroluminescent display device 100 may further include a buffer layer disposed between the substrate 110 and the active layer 122, and the etch stopper 132 may not be disposed thereon.

For convenience of description, only the driving thin film transistor has been illustrated from among various thin film transistors that may be included in the electroluminescent display device 100. In the figure, although the thin film transistor 120 has an inverted staggered structure or bottom gate structure in which the gate electrode 121 is disposed at an opposite side of the source electrode 123 and the drain electrode 124 with respect to the active layer 122, this is merely an example, and a thin film transistor, which has a coplanar structure or top gate structure in which the gate electrode 121 is disposed at the same side as the source electrode 123 and the drain electrode 124 with respect to the active layer 122, may also be used.

A passivation layer 133 may be disposed on the drain electrode 124 and the source electrode 123, and the color filter pattern 150 may be disposed on the passivation layer 133.

In this case, although the passivation layer 133 acts as a planarizing layer over an upper portion of the thin film transistor 120, the passivation layer 133 may also be disposed to conform to the shapes of surfaces of elements located below the passivation layer 133 instead of acts as a planarizing layer over the upper portion of the thin film transistor 120.

The color filter pattern 150 is configured to change a color of light emitted from the light-emitting layer 142, and may be one of a red color filter pattern, a green color filter pattern, and a blue color filter pattern.

The color filter pattern 150 may be disposed on positions which correspond to an emissive area on the passivation layer 133 and may be disposed only in some portions of the emissive area.

Emissive area refers to an area in which the light-emitting layer 142 emits light by the first electrode 141 and the second electrode 143, and the color filter pattern 150 being disposed on a position corresponding to the emissive area means that the color filter pattern 150 is disposed to prevent a blurring phenomenon and a ghost phenomenon which occur due to mixing of light emitted from adjacent emissive areas.

For example, the color filter pattern 150 may be disposed to overlap the emissive area and have a size smaller than or equal to that of the emissive area.

However, the arrangement position and size of the color filter pattern 150 may be determined by various factors such as a distance between the color filter pattern 150 and the first electrode 141, a distance between the color filter pattern 150 and the overcoat layer 160, and a distance between an emissive area and a non-emissive area, as well as the size and position of the emissive area.

A pixel of the present disclosure may include one or more subpixels. For example, a single pixel may include two to four subpixels.

Subpixel refers to a unit in which a specific type of color filter pattern 150 is formed or in which a single light-emitting diode D is capable of emitting a particular color without the color filter pattern 150. A pixel generally includes two or more subpixels, each of a different color.

Colors defined in a subpixel may include red R, green G, blue B, and optionally white W, but embodiments are not limited thereto. A pixel will generally include at least one of a R, G and B subpixel, and optionally also a W subpixel, but embodiments are not limited thereto.

The overcoat layer 160 may be disposed on the color filter pattern 150 and the passivation layer 133.

The passivation layer 133 may be omitted. That is, the overcoat layer 160 may be disposed on the thin film transistor 120.

In the figure, the color filter pattern 150 is disposed on the passivation layer 133, but embodiments are not limited thereto. The color filter pattern 150 may be disposed on any position between the overcoat layer 160 and the substrate 110.

The light-emitting diode D including the first electrode 141, the light-emitting layer 142, and the second electrode 143 may be disposed on the overcoat layer 160.

The first electrode 141 of the electroluminescent display device 100 according to the first embodiment of the present disclosure may include a plurality of holes H.

That is, the first electrode 141 may include the plurality of holes H exposing a top surface of the overcoat layer 160.

A width of each of the plurality of holes H may progressively decrease toward the overcoat layer 160. One way this can be achieved is by the sidewalls of the holes being sloped at an angle, as discussed later herein. Accordingly, connecting portions CP each having a triangular cross-section may be disposed between adjacent holes H.

Each of the connecting portions CP may include an undersurface c and first and second inclined surfaces a and b which are connected to the undersurface c.

A first angle $\theta 1$ formed between the undersurface c and the first inclined surface a and a second angle $\theta 2$ formed between the undersurface c and the second inclined surface b may be equal to each other, but embodiments are not limited thereto. Alternatively, the first angle $\theta 1$ and the second angle $\theta 2$ may be different from each other.

In this case, when the first angle $\theta 1$ and the second angle $\theta 2$ are less than 15 degrees, the light extraction efficiency may be low, and when the first angle $\theta 1$ and the second angle $\theta 2$ exceed 70 degrees, light, which begins to travel from an effective emissive area, travels an angle of 42 degrees or more such that the light is trapped inside the light-emitting diode D and the light extraction efficiency cannot be improved. Therefore, the first angle $\theta 1$ and the second angle $\theta 2$ may be in the range of 15 degrees to 70 degrees.

To block the spread of outgassing from the overcoat layer 160 to the light-emitting diode D, a second passivation layer (not shown) which has an insulating property may be disposed between the overcoat layer 160 and the first electrode 141.

In this case, the first electrode 141 may be an anode or cathode for supplying one of electrons or holes to the light-emitting layer 142.

A case in which the first electrode 141 of the electroluminescent display device 100 according to the first embodiment of the present disclosure is an anode will be described as an example.

The first electrode 141 may be formed of an amorphous metal oxide. For example, the amorphous metal oxide may include any one selected from the group consisting of indium zinc oxide (IZO), zinc tin oxide (ZTO), tin oxide ($SnO_2$), zinc oxide (ZnO), indium oxide ($In_2O_3$), gallium indium tin oxide (GITO), indium gallium zinc oxide (IGZO), zinc indium tin oxide (ZITO), indium gallium oxide (IGO), gallium oxide ($Ga_2O_3$), aluminum zinc oxide (AZO), and gallium zinc oxide (GZO), but is not limited thereto.

The first electrode 141 may be connected to the source electrode 123 of the thin film transistor 120 through a contact hole formed in the overcoat layer 160 and may be separately formed in each subpixel area.

Although the electroluminescent display device 100 according to the first embodiment of the present disclosure has been described as an example in which the thin film transistor 120 is an N-type thin film transistor and the first electrode 141 is connected to the source electrode 123, embodiments are not limited thereto. When the thin film transistor 120 is a P-type thin film transistor, the first electrode 141 may be connected to the drain electrode 124.

The first electrode 141 may also be electrically connected to the light-emitting layer 142 by being in contact with the light-emitting layer 142 with a conductive material therebetween.

A bank layer 136 may be disposed on the overcoat layer 160 and the first electrode 141.

The bank layer 136 may include an opening exposing the first electrode 141.

The bank layer 136 may be disposed between adjacent pixel or subpixel areas and serve to differentiate the adjacent pixel or subpixel areas.

The light-emitting layer 142 may be disposed on the first electrode 141.

The light-emitting layer 142 may have a tandem white structure in which a plurality of light-emitting layers are stacked to emit white light.

For example, the light-emitting layer 142 may include a first light-emitting layer configured to emit blue light and a second light-emitting layer disposed on the first light-emitting layer and configured to emit light having a color which turns white when mixed with blue.

The second light-emitting layer may be a light-emitting layer configured to emit yellow-green light.

The light-emitting layer 142 may include only light-emitting layers that emit one of blue light, red light, and green light. In this case, the electroluminescent display device 100 may not include the color filter pattern 150.

In this case, a luminescent material of the light-emitting layer 142 may be an organic luminescent material or an inorganic luminescent material such as a quantum dot.

Also, the light-emitting layer 142 may be disposed to conform to the shape of the first electrode 141.

That is, the light-emitting layer 142 may be disposed to conform to the shape of the first electrode 141 including the plurality of holes H.

The second electrode 143 for supplying one of electrons or holes to the light-emitting layer 142 may be disposed on the light-emitting layer 142.

In this case, the second electrode 143 may be an anode or a cathode.

A case in which the second electrode 143 of the electroluminescent display device 100 according to the first embodiment of the present disclosure is a cathode will be described as an example.

The second electrode 143 may be formed of a conductive material having relatively low work function and may be located substantially all over a display area. For example, the second electrode 143 may be formed of aluminum (Al), magnesium (Mg), silver (Ag), or an alloy thereof, but embodiments are not limited thereto.

The second electrode 143 is disposed in a shape which follows the morphology of the light-emitting layer 142. Namely, it will conform to the topology of the shape of upper surface of layer 142.

The first electrode 141, the light-emitting layer 142, and the second electrode 143 form the light-emitting diode D.

That is, the light-emitting layer 142 and the second electrode 143 are disposed in shapes which follow the morphology of the top surface of the first electrode 141. Consequently, the light-emitting layer 142 and the second electrode 143 have a concave morphology at the holes H of the first electrode 141 and have convex morphology at the connecting portions CP.

In one embodiment, the layers 141, 142 and 143 are deposited as fully conformal layers on the exposed substrate. A fully conformal layer has a uniform thickness at all places, regardless of the surface on which it is deposited, with the top surface of the fully conformal layer having the exact same shape as the top surface of the layer on which it is deposited. A partially conformal layer generally has a uniform thickness and its top surface generally has the same shape as the top surface on which it is deposited, but it may have slight variations in thickness at bends, corners, edges and depressions, steep slopes or step changes in the underlying surface on which it is deposited. Accordingly, in one embodiment, the first electrode 141 is a deposited as a fully conformal layer. In other embodiments, it might also be deposited as partially conformal layer, being slightly thicker in depressions and at the top of protrusions and somewhat thinner on steep slope surfaces between the depressions and protrusions.

In this way, the shape of the light-emitting diode D may be realized using the plurality of holes H of the first electrode 141 and the connecting portions CP.

Figure 4:
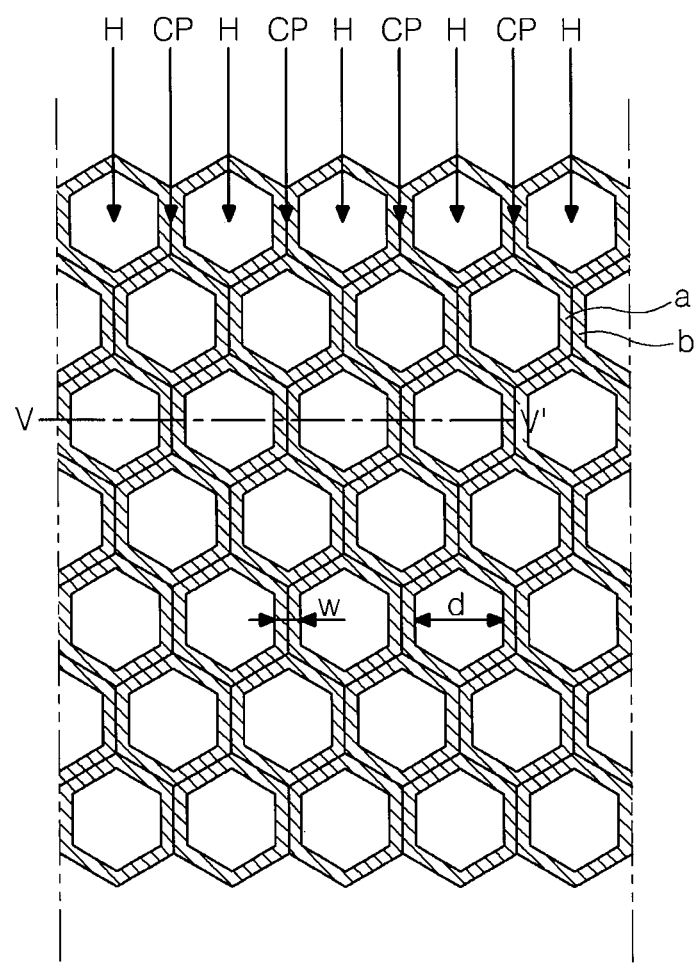
FIG. 4 is a plan view schematically illustrating the electroluminescent display device according to the first embodiment of the present disclosure.

FIG. 4 is a plan view schematically illustrating the electroluminescent display device according to the first embodiment of the present disclosure.

As illustrated in FIG. 4, the light-emitting layer 142 and the second electrode 143 of the electroluminescent display device 100 see FIG. 3 according to the first embodiment of the present disclosure may be disposed in shapes which follow the morphology of the top surface of the first electrode 141.

In this case, the first electrode 141 may include a plurality of holes H.

Each of the plurality of holes H may have a hexagonal shape in plan view, but embodiments are not limited thereto. Each of the plurality of holes H may have various other shapes in plan view, such as a semicircular shape, a semielliptical shape, a quadrilateral shape, and a circular shape, An area of each of the plurality of holes H may progressively increase from the bottom surface to the top surface of the first electrode 141.

Accordingly, connecting portions CP each including a first inclined surface a and a second inclined surface b may be disposed between adjacent holes H.

The connecting portions CP are connected to each other in plan view, and by the connecting portions CP, the plurality of holes H of the first electrode 141 may be disposed to be spaced apart from each other.

The connecting portions CP may be disposed at a distance d, which is equal to a width of a bottom surface of the hole H of the first electrode 141, from each other, and a width w of the connecting portion CP may be narrower than the distance d. The hole H has as its bottom surface the upper surface of overcoat layer 160 and as its sidewalls the connecting portions CP.

The shape of the plurality of holes H of the first electrode 141 may be formed through a process such as photolithography, wet etching, and dry etching. The morphology of the sidewalls of the holes H of the first electrode 141 may be controlled by adjusting a heat treatment process performed in this case.

Figure 5:
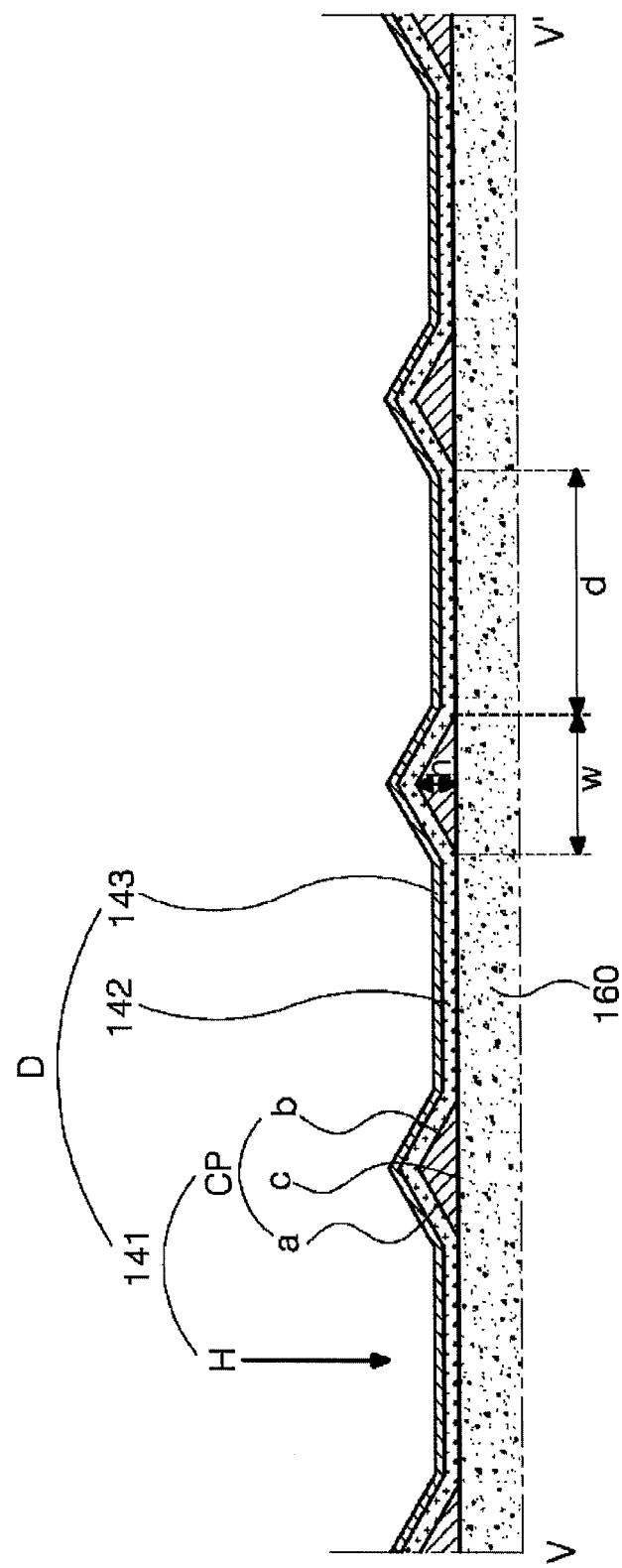
FIG. 5 is a cross-sectional view taken along line V-V' of FIG. 4.

FIG. 5 is a cross-sectional view taken along line V-V' of FIG. 4.

As illustrated in FIG. 5, the light-emitting diode D including the first electrode 141, the light-emitting layer 142, and the second electrode 143 may be disposed on the overcoat layer 160.

In this case, the first electrode 141 may include a plurality of holes H and connecting portions CP.

Each of the plurality of holes H may be formed to pass through a bottom surface and a top surface of the first electrode 141. Namely, the hole starts at the top surface of the connecting portions CP of the first electrode 141 and includes all of the sidewall area and the bottom surface.

An area of each of the plurality of holes H may progressively increase from the bottom surface to the top surface of the first electrode 141.

Accordingly, connecting portions CP each having a triangular cross-section may be disposed between adjacent holes H.

Each of the connecting portions CP may include an undersurface c and first and second inclined surfaces a and b which are connected to the undersurface c. The inclined surfaces a and b are for the sidewalls of the holes H.

The connecting portions CP may be spaced apart at a predetermined distance. A distance d between the connecting portions CP corresponding to a width of a bottom surface of the hole may have a larger value than a width w of each of the connecting portions CP corresponding to a length of the undersurface of the connecting portion.

For example, the width w of the connecting portion CP may be in the range of 2.5 μm to 3 μm, and the distance d between the plurality of connecting portions CP may be in the range of 4 μm to 5 μm, but embodiments are not limited thereto.

A height h of the connecting portion CP may be in the range of 0.7 μm to 0.8 μm, but embodiments are not limited thereto.

Figure 6:
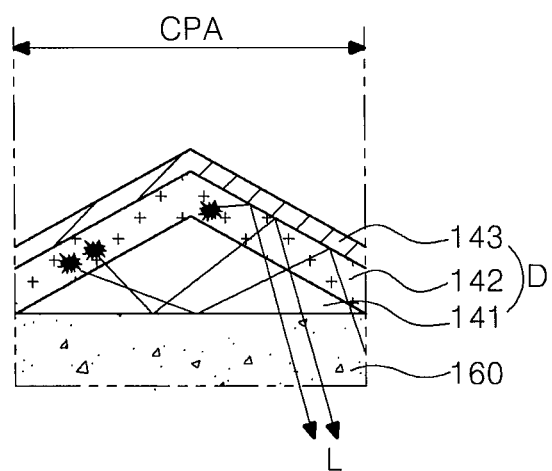
FIG. 6 is a view schematically illustrating an optical path in a connecting portion area of the electroluminescent display device according to the first embodiment of the present disclosure.

FIG. 6 is a view schematically illustrating an optical path in a connecting portion area of the electroluminescent display device according to the first embodiment of the present disclosure.

As illustrated in FIG. 6, in a connecting portion area CPA, light L, which has been totally reflected inside the first electrode 141 and the light-emitting layer 142 and is unable to be output to the outside from among light L emitted from the light-emitting layer 142, is re-reflected at the second electrode 143, which is disposed corresponding to an inclined surface a of a connecting portion CP, and is extracted to the outside. In this way, the light extraction efficiency may be improved.

Figure 7A:
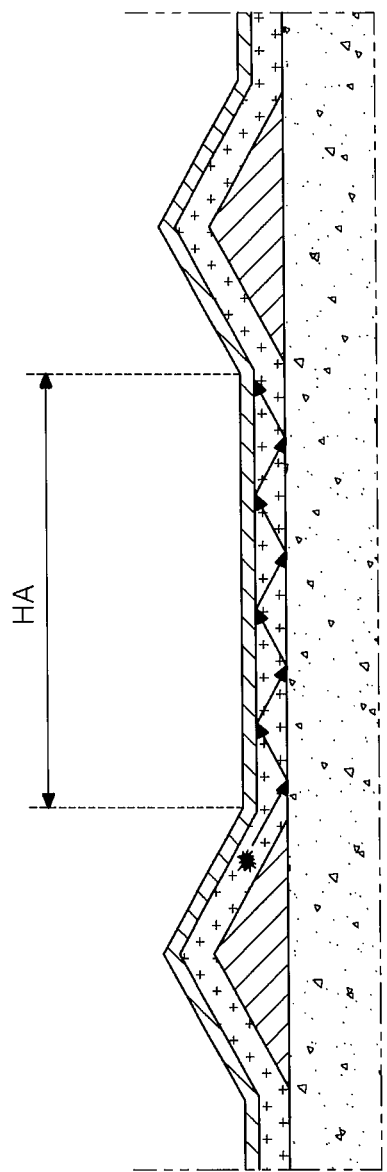
FIG. 7A is a view schematically illustrating an optical path in a hole area of the electroluminescent display device according to the first embodiment of the present disclosure.
Figure 7B:
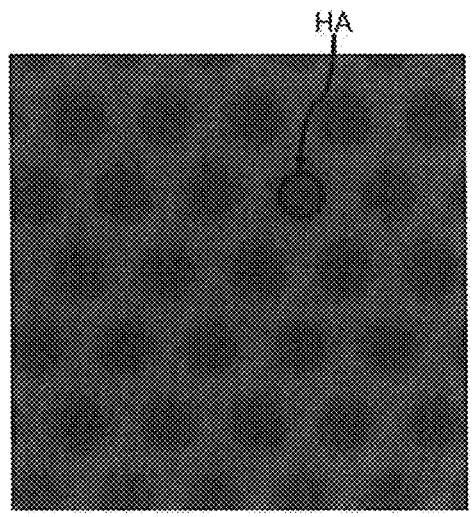
FIG. 7B is a picture in which a dark area is observed from the hole area of the electroluminescent display device according to the first embodiment of the present disclosure.

FIG. 7A is a view schematically illustrating an optical path in a hole area of the electroluminescent display device according to the first embodiment of the present disclosure, and FIG. 7B is a picture in which a dark area is observed from the hole area of the electroluminescent display device according to the first embodiment of the present disclosure. Description will be given with reference to FIGS. 5, 7A, and 7B.

As illustrated in FIG. 7A, light L emitted from the light-emitting layer 142 might not be emitted to the outside from an area disposed between the spaced-apart connecting portions CP of the first electrode 141, that is, in a hole area HA, in some embodiments. Instead, in some embodiments, depending on the properties of the overcoat layer 160, it could be totally reflected and travels inside the light-emitting layer 142.

Accordingly, as illustrated in FIG. 7B, the result could be in some embodiments the hole area HA is observed as a dark area.

As described above, although the plurality of holes H are formed in the first electrode 141 so that the light extraction efficiency of connecting portion areas CPA between the plurality of holes H may be improved in the electroluminescent display device 100 according to the first embodiment of the present disclosure, in some embodiments, the result might occur that the hole area HA is observed as a dark area.

Hereinafter, description will be given on an electroluminescent display device according to a second embodiment, which is capable of effectively preventing the occurrence of a dark area that is observed.

Second Embodiment

Hereinafter, detailed description of configurations identical or similar to those of the first embodiment may be omitted.

Figure 8:
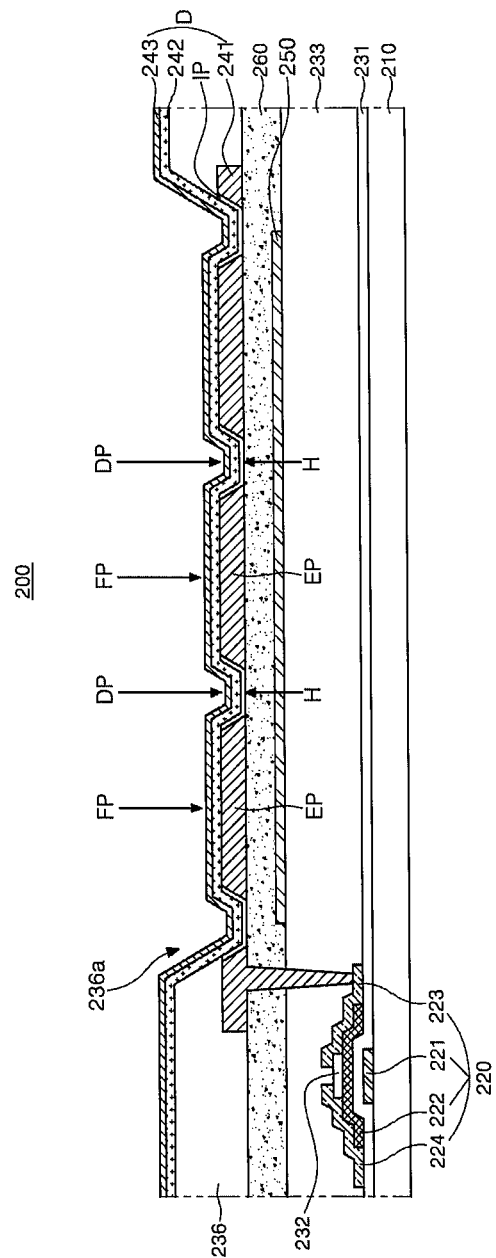
FIG. 8 is a cross-sectional view schematically illustrating an electroluminescent display device according to a second embodiment of the present disclosure.

FIG. 8 is a cross-sectional view schematically illustrating an electroluminescent display device according to a second embodiment of the present disclosure.

As illustrated in FIG. 8, an electroluminescent display device 200 according to the second embodiment of the present disclosure may include a substrate 210, a thin film transistor 220, a color filter pattern 250, an overcoat layer 260, and a light-emitting diode D electrically connected to the thin film transistor 220.

The thin film transistor 220 may include a gate electrode 221, an active layer 222, a source electrode 223, and a drain electrode 224.

A passivation layer 233 may be disposed on the thin film transistor 220, and the color filter pattern 250 may be disposed on the passivation layer 233.

The color filter pattern 250 is configured to change a color of light emitted from the light-emitting layer 242, and may be one of a red color filter pattern, a green color filter pattern, and a blue color filter pattern.

The overcoat layer 260 may be disposed on the color filter pattern 250 and the passivation layer 233.

The overcoat layer 260 may be formed of an organic material having a reflective index in the range of about 1.5 to 1.55, but embodiments are not limited thereto.

The light-emitting diode D including the first electrode 241, an insulating pattern IP, the light-emitting layer 242, and the second electrode 243 may be disposed on the overcoat layer 260.

The first electrode 241 of the electroluminescent display device 200 according to the second embodiment of the present disclosure may include a plurality of holes H exposing the overcoat layer 260.

A width of each of the plurality of holes H may progressively decrease toward the overcoat layer 260.

That is, each of the plurality of holes H formed in the first electrode 241 may have a reverse trapezoidal cross-section, but embodiments are not limited thereto.

An electrode portion EP of the first electrode 241 which is defined as an area between adjacent holes H of the first electrode 241 may have a trapezoidal cross-section.

A top surface of the electrode portion EP between adjacent holes H may be planarized.

In an emissive area EA, the first electrode 241 may include, when seen from a cross-sectional view, holes H each having a reverse trapezoidal cross-section and electrode portions EP each having a trapezoidal cross-section, which are alternately disposed.

To block the spread of outgassing from the overcoat layer 260 to the light-emitting diode D, a second passivation layer (not shown) which has an insulating property may be disposed between the overcoat layer 260 and the first electrode 241.

In this case, the first electrode 241 may be an anode or cathode for supplying one of electrons or holes to the light-emitting layer 242.

A case in which the first electrode 241 of the electroluminescent display device 200 according to the second embodiment of the present disclosure is an anode will be described as an example.

The first electrode 241 may be formed of an amorphous metal oxide. For example, the amorphous metal oxide may include any one selected from the group consisting of IZO, ZTO, $SnO_2$, ZnO, $In_2O_3$, GITO, IGZO, ZITO, IGO, $Ga_2O_3$, AZO, and GZO.

The first electrode 241 may be connected to the source electrode 223 of the thin film transistor 220 through a contact hole formed in the overcoat layer 260 and may be separately formed in each pixel area.

Although the electroluminescent display device 200 according to the second embodiment of the present disclosure has been described using an example in which the thin film transistor 220 is an N-type thin film transistor and the first electrode 241 is connected to the source electrode 223, embodiments are not limited thereto. When the thin film transistor 220 is a P-type thin film transistor, the first electrode 241 may also be connected to the drain electrode 224.

The first electrode 241 may also be electrically connected to the light-emitting layer 242 by being in contact with the light-emitting layer 242 with a conductive material therebetween.

The first electrode 241 may have a refractive index of about 1.8 or higher, but embodiments are not limited thereto.

A bank layer 236 may be disposed on the overcoat layer 260 and the first electrode 241.

The bank layer 236 may include an opening 236a exposing the first electrode 241.

The bank layer 236 may be disposed between adjacent pixel or subpixel areas and serve to differentiate the adjacent pixel or subpixel areas.

The bank layer 236 may be formed of a photo acrylic organic material having a refractive index of 1.6 or lower, but embodiments are not limited thereto.

In the electroluminescent display device 200 according to the second embodiment of the present disclosure, an insulating pattern IP may be disposed in the plurality of holes H formed in the first electrode.

That is, the insulating pattern IP may be disposed in each of the plurality of holes H of the first electrode 241. However, embodiments are not limited thereto, and the insulating pattern IP may be disposed only in some of the plurality of holes H of the first electrode 241.

The insulating pattern IP may be disposed in a shape which follows the morphology of the hole H. That is, the insulating pattern IP may be disposed to conform to the shape of a bottom surface and inclined surfaces of the sidewalls of the hole H. The insulating pattern IP is conformally deposited on the sidewalls of the electrode portions EP. That is, the insulating pattern IP may be disposed on an inclined surface of the electrode portion EP and a top surface of the overcoat layer 260 exposed by the hole H. Accordingly, a top surface of the electrode portion EP between the holes H may be exposed without the insulating pattern IP disposed thereon.

The insulating pattern IP may be formed of an inorganic material. For example, the insulating pattern IP may be formed of silicone oxide (SiOx) or silicone nitride (SiNx), but embodiments are not limited thereto.

A refractive index of the insulating pattern IP may be in the range of 1.5 to 2, but embodiments are not limited thereto.

The light-emitting layer 242 may be disposed on the first electrode 241, the insulating pattern IP, and the bank layer 236.

The light-emitting layer 242 may have a tandem white structure in which a plurality of light-emitting layers are stacked to emit white light.

For example, the light-emitting layer 242 may include a first light-emitting layer configured to emit blue light and a second light-emitting layer disposed on the first light-emitting layer and configured to emit light having a color which turns white when mixed with blue.

The second light-emitting layer may be a light-emitting layer configured to emit yellow-green light.

The light-emitting layer 242 may include only light-emitting layers that emit one of blue light, red light, and green light. In this case, the electroluminescent display device 200 may not include the color filter pattern 250.

The light-emitting layer 242 may be formed of an organic luminescent material having a refractive index of about 1.8 or higher, but embodiments are not limited thereto. The light-emitting layer 242 may also be formed of an inorganic luminescent material such as a quantum dot.

The light emitting layers 142 and 242 can be made of any acceptable layers or combination of sublayers in which one or more of the sublayers emit light of types well known in the art. In some embodiments, the light-emitting layer includes one or more sublayers that themselves do not emit light, but are put of the overall light-emitting layer. In some embodiments, the light-emitting layer is in direct contact with overcoat layer and in other embodiments, it is in direct contact with an insulating layer that is in direct contact with the overcoat layer. Yet, the sublayer that itself contacts the overcoat layer or the insulating layer might not emit light, but rather the light may be emitted by sublayer that is in a central region of the overall light-emitting layer.

The light-emitting layer 242 may be disposed to conform to the shapes of the first electrode 241 and the insulating pattern IP in an emissive area EA.

That is, the light-emitting layer 242 may be disposed in a shape which follows the morphology of top surfaces of the electrode portions EP and the insulating patterns IP.

For example, the light-emitting layer 242 may be formed to be flat on the electrode portions EP and formed to be recessed along the morphology of the insulating patterns IP on the insulating patterns IP.

The second electrode 243 for supplying one of electrons or holes to the light-emitting layer 242 may be disposed on the light-emitting layer 242.

In this case, the second electrode 243 may be an anode or a cathode.

A case in which the second electrode 243 of the electroluminescent display device 200 according to the second embodiment of the present disclosure is a cathode will be described as an example.

The second electrode 243 may be formed of a conductive material having relatively low work function and may be located substantially all over a display area. For example, the second electrode 243 may be formed of Al, Mg, Ag, or an alloy thereof, but embodiments are not limited thereto.

The second electrode 243 is disposed in a shape which follows the morphology of the light-emitting layer 242.

The first electrode 241, the insulating pattern IP, the light-emitting layer 242, and the second electrode 243 form the light-emitting diode D. The light-emitting layer 242 and the second electrode 243 are disposed in shapes which follow the morphology of the insulating pattern IP, which is formed in each of the plurality of holes H of the first electrode 241, and top surfaces of the electrode portions EP, which are disposed between the holes H, in the emissive area EA.

That is, the light-emitting diode D may have a shape in which flat portions FP and depressed portions DP are alternately disposed in the emissive area EA.

Through such a structure, the electroluminescent display device 200 according to the second embodiment of the present disclosure induces emission at the flat portions FP of the light-emitting diode D through the insulating patterns IP disposed on the depressed portions DP of the light-emitting diode D, and simultaneously, light, which has not been output to the outside due to total reflection of the light inside the light-emitting diode D, is reflected through the second electrode 243 at the depressed portions DP so that the light can be extracted to the outside.

Accordingly, an occurrence of a dark area may be effectively prevented while the light extraction efficiency is improved.

Figure 9:
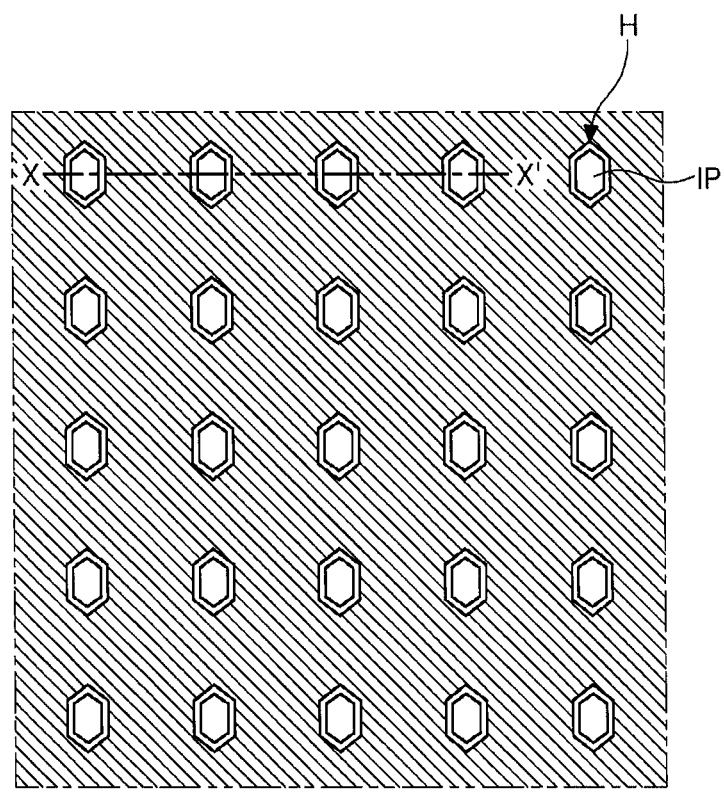
FIG. 9 is a plan view schematically illustrating the electroluminescent display device according to the second embodiment of the present disclosure.
Figure 10:
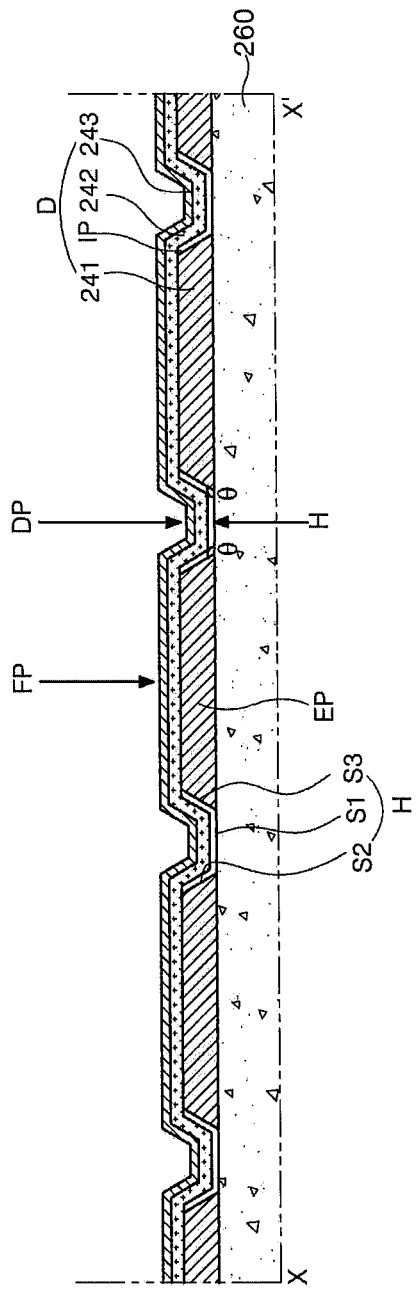
FIG. 10 is a cross-sectional view taken along line X-X' of FIG. 9.

FIG. 9 is a plan view schematically illustrating the electroluminescent display device according to the second embodiment of the present disclosure, and FIG. 10 is a cross-sectional view taken along line X-X' of FIG. 9.

As illustrated in FIGS. 9 and 10, a light-emitting diode D of an electroluminescent display device 200 according to the second embodiment of the present disclosure may have a shape in which flat portions FP and depressed portions DP are alternately disposed in an emissive area EA.

A first electrode 241 may include a plurality of holes H.

Each of the plurality of holes H may have a hexagonal shape in plan view, but embodiments are not limited thereto. Each of the plurality of holes H may have various other shapes in plan view, such as a semicircular shape, a semielliptical shape, a quadrilateral shape, and a circular shape.

An area of each of the plurality of holes H may progressively increase toward the light-emitting layer 242. From the top surface downward, the area of each hole will progressively decrease until it reaches the bottom of the hole H, which is the overcoat layer 260. The insulating pattern IP is deposited in the hole H formed in the first electrode 241.

Each of the plurality of holes H formed in the first electrode 241 may have a reverse trapezoidal cross-section, but embodiments are not limited thereto.

The shape of the plurality of holes H of the first electrode 241 may be formed through a process such as photolithography, wet etching, and dry etching. The morphology of the holes H of the first electrode 241 may be adjusted by adjusting a heat treatment process performed in this case.

An angle θ formed between a bottom surface S1 and first and second inclined surfaces S2 and S3 of the sidewalls of each of the plurality of holes H may be in the range of 140 degrees to 160 degrees, but embodiments are not limited thereto.

An electrode portion EP of the first electrode 241, which is defined as an area between adjacent holes H of the first electrode 241, may have a trapezoidal cross-section.

A top surface of the electrode portion EP may be flattened.

In an emissive area EA, the first electrode 241 may include, when seen from cross-sectional view, holes H each having a reverse trapezoidal cross-section and electrode portions EP each having a trapezoidal cross-section, which are alternately disposed.

An insulating pattern IP may be disposed in each of the plurality of holes H of the first electrode 241. However, embodiments are not limited thereto, and the insulating pattern IP may be disposed only in some of the plurality of holes H of the first electrode 241.

The insulating pattern IP may be disposed in a shape which follows the morphology of the hole H. That is, the insulating pattern IP may be disposed along shapes of a bottom surface S1 and inclined surfaces S2 and S3 of sidewalls of the first electrode 241 to form the hole H.

The insulating pattern IP may be formed of an inorganic material. For example, the insulating pattern IP may be formed of SiOx or SiNx, but embodiments are not limited thereto.

A refractive index of the insulating pattern IP may be in the range of 1.5 to 2, but embodiments are not limited thereto.

The light-emitting layer 242 may be disposed on the first electrode 241 and the insulating pattern IP.

The light-emitting layer 242 may be formed of an organic luminescent material having a refractive index of about 1.8 or higher, but embodiments are not limited thereto. The light-emitting layer 242 may also be formed of an inorganic luminescent material such as a quantum dot.

The light-emitting layer 242 may be disposed to conform to the shapes of the first electrode 241 and the insulating pattern IP in an emissive area EA.

That is, the light-emitting layer 242 may be disposed in a shape which follows the morphology of top surfaces of the electrode portions EP and the insulating patterns IP.

For example, the light-emitting layer 242 may be formed to be flat on the electrode portions EP and formed to be recessed along the morphology of the insulating patterns IP on the insulating patterns IP.

The second electrode 243 may be disposed on the light-emitting layer 242.

The second electrode 243 may be formed of a conductive material having relatively low work function and may be located substantially all over a display area. For example, the second electrode 243 may be formed of Al, Mg, Ag, or an alloy thereof, but embodiments are not limited thereto.

The second electrode 243 may be disposed in a shape which follows the morphology of the light-emitting layer 242.

The first electrode 241, the insulating pattern IP, the light-emitting layer 242, and the second electrode 243 form the light-emitting diode D, and the light-emitting layer 242 and the second electrode 243 are disposed in shapes which follow the morphology of the insulating pattern IP, which is formed in each of the plurality of holes H of the first electrode 241, and top surfaces of the electrode portions EP, which are disposed between the holes H, in the emissive area EA.

Accordingly, the light-emitting diode D may have a shape in which flat portions FP and depressed portions DP are alternately disposed in the emissive area EA.

Figure 11:
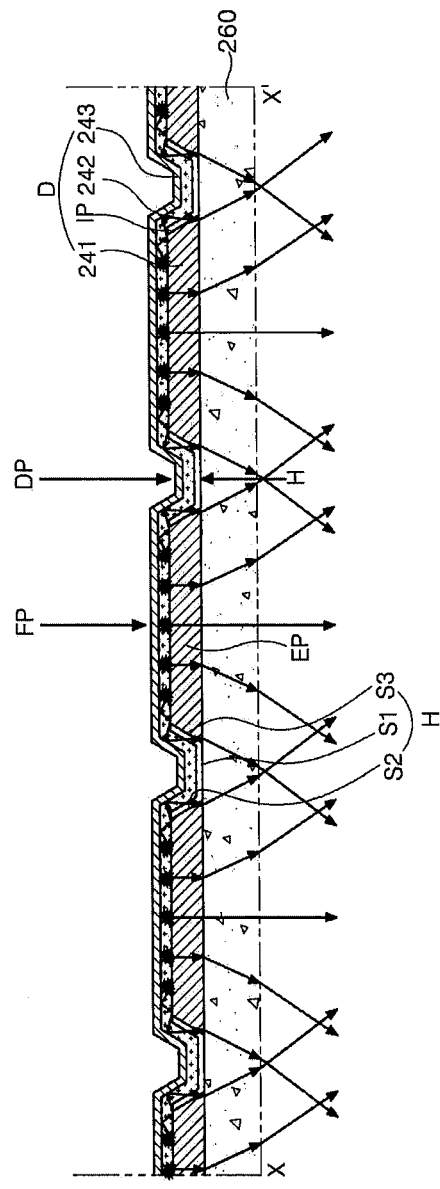
FIG. 11 is a view schematically illustrating an optical path in the electroluminescent display device according to the second embodiment of the present disclosure.

FIG. 11 is a view schematically illustrating an optical path in the electroluminescent display device according to the second embodiment of the present disclosure. Description will be given with reference to FIGS. 10 and 11.

As illustrated in FIG. 11, an insulating pattern IP is disposed on a depressed portion DP of a light-emitting diode D in an electroluminescent display device 200 of FIG. 8 according to the second embodiment of the present disclosure. In this way, emission is induced at a flat portion FP of the light-emitting diode D, and an amount of extracted light may be increased.

That is, since a light-emitting layer 242 is disposed in a sandwich-like manner between a first electrode 241 and a second electrode 243 at the flat portion FP of the light-emitting diode D, the flat portion FP of the light-emitting diode D becomes a main emissive area. Since an area of the flat portion FP is greater than an area of the depressed portion DP, an amount of extracted light may be increased due to an increase in an emissive area.

Figure 12A:
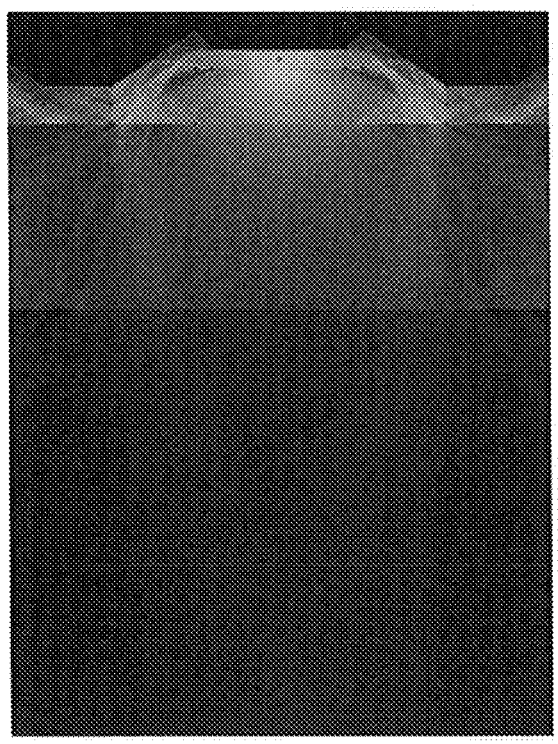
FIGS. 12A and 12B are views schematically illustrating a light output state in accordance with a refractive index of an insulating pattern of the electroluminescent display device according to the second embodiment of the present disclosure.
Figure 12B:

Further, light, which has not been output to the outside due to total reflection of the light inside the light-emitting diode D from among light output from the flat portion FP of the light-emitting diode D, is reflected through a second electrode 243 at the depressed portion DP so that the light is output to an area in which a hole H is formed. Therefore, an occurrence of a dark area may be effectively prevented while light extraction efficiency is further improved FIGS. 12A and 12B are views schematically illustrating a light output state in accordance with a refractive index of an insulating pattern of the electroluminescent display device according to the second embodiment of the present disclosure. Description will be given with reference to FIGS. 10, 12A, and 12B.

In FIGS. 12A and 12B, angles θ formed between a bottom surface S1 and a first inclined surface S2 and between the bottom surface S1 and a second inclined surfaces S3 of each of the plurality of holes H of the electroluminescent display device 200 of FIG. 8 may be equal to each other, i.e., 150 degrees. FIGS. 12A and 12B illustrate optical paths in accordance with a change in a refractive index of the insulating pattern IP.

FIG. 12A illustrates a light output state when a refractive index of the insulating pattern IP is 2, and FIG. 12B illustrates a light output state when a refractive index of the insulating pattern IP is 1.5.

Comparing FIGS. 12A and 12B, it can be recognized that the light extraction efficiency is the highest in the case shown in FIG. 12B in which the refractive index of the insulating pattern IP is 1.5.

That is, light, which has not been output to the outside due to total reflection of the light inside the light-emitting diode D from among light output from a flat portion FP of the light-emitting diode D, is reflected through a second electrode 243 at a depressed portion DP so that the light may be uniformly output to the outside.

Consequently, in the electroluminescent display device 200 of FIG. 8 according to the second embodiment of the present disclosure, a refractive index of the insulating pattern IP may be set as 1.5 so that the light extraction efficiency is further improved.

In the electroluminescent display device 200 of FIG. 8 according to the second embodiment of the present disclosure, emission at the flat portion FP is induced through the insulating pattern IP disposed on the depressed portion DP of the light-emitting diode D, and simultaneously, light, which has not been output to the outside due to total reflection of the light inside the light-emitting diode D, is reflected through the second electrode 243 at the depressed portion DP so that the light can be uniformly extracted to the outside.

Accordingly, an occurrence of a dark area can be effectively prevented while the light extraction efficiency is improved. Comparing the embodiment of FIGS. 3-7A to the embodiment of FIGS. 8-11, one of the differences is the area of the hole in the first electrode compared to the area of the metal of the first electrode. In embodiment of FIG. 3-7A, the area of the holes is over 80% of the total area of the first electrode and in some embodiments, is over 90% of the area of the first electrode. Based on the slope angle of the sidewalls of the holes, which are made of metal and assist in causing the light emitting layer to emit light, the area of light emission is less than 20% of the area of the first electrode. On the other hand, in the second embodiment of FIG. 8-11, the area of the holes is less than 40% of the total area of the first electrode and in some embodiments, is less than 25% of the area of the first electrode. Based on the slope angle of the sidewalls of the holes, which are made of metal and assist in causing the light emitting layer to emit light, the area of light emission is greater than 80% of the area of the first electrode. Accordingly, the amount of light emitted by the second embodiment will be greater since the area of the metal in the first electrode is a significant factor in the area of the light emitting layer that will emit light.

In the present disclosure, emission at a flat portion of a light-emitting diode is induced through an insulating pattern disposed on a depressed portion of the light-emitting diode, and simultaneously, light, which has not been output to the outside due to total reflection of the light inside the light-emitting diode, is reflected through a second electrode at the depressed portion so that the light can be uniformly extracted to the outside. In this way, an occurrence of a dark area can be effectively prevented while light extraction efficiency is improved.

The present disclosure has been described on with reference to exemplary embodiments thereof. However, those of ordinary skill in the art should understand that various modifications and changes may be made to the present disclosure within the scope not departing from the technical spirit and scope of the present disclosure described in the claims below.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display device, comprising:
   a substrate having a display area, the display area having a plurality of subpixel areas;
   an overcoat layer disposed over the substrate;
   a first electrode disposed on the overcoat layer;
   a bank layer disposed on the overcoat layer and the first electrode, the bank layer having an opening to expose the first electrode in each subpixel area;
   a light-emitting layer disposed on the first electrode; and
   a second electrode disposed on the light-emitting layer,
   wherein the first electrode within the opening of the bank layer has a plurality of holes therein, the holes exposing a top surface of the overcoat layer, wherein a thickness of the first electrode is thinner in a first region at an edge of a respective holes than in a second region that is spaced farther apart from the edge of the respective hole than the first region, thereby forming an inclined wall surface at the edge of the hole.

2. The electroluminescent display device of claim 1, wherein each of the plurality of holes has a vertical section with an upper side having a first length and a lower side having a second length different from the first length.

3. The electroluminescent display device of claim 2, wherein the first length is larger than the second length.

4. The electroluminescent display device of claim 1, wherein each of the plurality of holes has a bottom cross section having a first area and a top cross section having a second area different from the second area.

5. The electroluminescent display device of claim 3, wherein the first area is smaller than the second area.

6. The electroluminescent display device of claim 1, wherein the first electrode further comprises connecting portions between adjacent holes of the plurality of holes.

7. The electroluminescent display device of claim 6, wherein the connecting portions have a triangle vertical section.

8. The electroluminescent display device of claim 7, wherein a first angle formed between a lower side and a first lateral side of the triangle vertical section and a second angle formed between the lower side and a second lateral side of the triangle vertical section are equal to each other or different from each other.

9. The electroluminescent display device of claim 8, wherein the first angle and the second angle are in a range of 15 degrees to 70 degrees.

10. The electroluminescent display device of claim 1, wherein the light-emitting layer is disposed to conform to a shape of the first electrode having the plurality of holes, and the light-emitting layer is in direct contact with the top surface of the overcoat layer.

11. The electroluminescent display device of claim 10, wherein the second electrode is disposed in a shape which follows morphology of the light-emitting layer.

12. The electroluminescent display device of claim 6, wherein the connecting portions are disposed at a distance, which is equal to a width of a lower side of a vertical section of each of the plurality of holes of the first electrode, from each other, and a width of a lower side of a vertical section of the connecting portion is configured to be narrower than the distance.

13. The electroluminescent display device of claim 1, further comprising an insulating pattern disposed in at least some of the plurality of holes of the first electrode, wherein the insulating pattern is in direct contact with the top surface of the overcoat layer.

14. The electroluminescent display device of claim 13, wherein an angle formed between a lower side and lateral sides of a vertical section of the holes is in a range of 140 degrees to 160 degrees.

15. The electroluminescent display device of claim 13, wherein the first electrode further comprises electrode portions between adjacent holes of the plurality of holes.

16. The electroluminescent display device of claim 15, wherein the holes and the electrode portions are alternately disposed.

17. The electroluminescent display device of claim 13, wherein the insulating patterns are disposed in a shape which follows morphology of the holes.

18. The electroluminescent display device of claim 17, wherein the light-emitting layer is disposed to conform to a shape of the first electrode and the insulating patterns.

19. The electroluminescent display device of claim 18, wherein the second electrode is disposed in a shape which follows morphology of the light-emitting layer.

20. The electroluminescent display device of claim 13, wherein the insulating pattern has a refractive index in a range of 1.5 to 2.

21. The electroluminescent display device of claim 13, wherein an area of the holes is less than 40% of a total area of the first electrode, or is less than 25% of the total area of the first electrode.

22. The electroluminescent display device of claim 1, wherein each of the plurality of holes is configured to have a hexagonal shape, a semicircular shape, a semielliptical shape, a quadrilateral shape, or a circular shape in a plan view.

23. The electroluminescent display device of claim 1, wherein the light-emitting layer is in direct contact with the side surface of the first electrode.

24. The electroluminescent display device of claim 13, wherein the insulating pattern is disposed between the first electrode and the light-emitting layer.

25. The electroluminescent display device of claim 24, wherein the insulating pattern is in direct contact with the side surface of the first electrode.

26. The electroluminescent display device of claim 1, further comprising:
an insulating pattern disposed in at least some of the plurality of holes of the first electrode, wherein a thickness of the insulating pattern is smaller than a thickness of the first electrode between adjacent holes.

* * * * *